United States Patent
Nam et al.

(10) Patent No.: US 9,229,317 B2
(45) Date of Patent: Jan. 5, 2016

(54) BLANKMASK AND METHOD FOR FABRICATING PHOTOMASK USING THE SAME

(71) Applicant: S&S TECH Co.,Ltd., Daegu-si (KR)

(72) Inventors: Kee-Soo Nam, Daegu-si (KR); Geung-Won Kang, Daegu-si (KR); Chul-Kyu Yang, Daegu-si (KR); Jong-Hwa Lee, Daegu-si (KR); Kyu-Jin Jang, Daegu-si (KR)

(73) Assignee: S&S TECH CO., LTD., Daegu-Si (KR)

( * ) Notice: Subject to any disclaimer, the term of this patent is extended or adjusted under 35 U.S.C. 154(b) by 168 days.

(21) Appl. No.: 13/928,618

(22) Filed: Jun. 27, 2013

(65) Prior Publication Data

US 2014/0004449 A1    Jan. 2, 2014

(30) Foreign Application Priority Data

Jun. 29, 2012    (KR) .................. 10-2012-0070772

(51) Int. Cl.
*G03F 1/50* (2012.01)
(52) U.S. Cl.
CPC ....................... *G03F 1/50* (2013.01)
(58) Field of Classification Search
CPC .......................................................... G03F 1/50
USPC ............................................ 430/5, 322, 323
See application file for complete search history.

(56) References Cited

U.S. PATENT DOCUMENTS

2005/0170655 A1*  8/2005  Bencher et al. ............... 438/700
2009/0246647 A1  10/2009  Hashimoto et al.
2010/0081066 A1   4/2010  Nozawa
2012/0156596 A1*  6/2012  Kominato et al. ................. 430/5
2013/0323625 A1* 12/2013  Tu et al. ............................ 430/5

FOREIGN PATENT DOCUMENTS

| JP | 2009-104174 A | 5/2009 |
| JP | 2010-009001 A | 1/2010 |
| JP | 2010237499 A | 10/2010 |
| JP | 2011-209762 A | 10/2011 |
| JP | 2011-227461 A | 11/2011 |
| JP | 2013-238778 A | 11/2013 |
| TW | 200736819 A | 10/2007 |
| WO | 2012070209 A1 | 5/2012 |
| WO | 2012086744 A1 | 6/2012 |

* cited by examiner

*Primary Examiner* — Stephen Rosasco
(74) *Attorney, Agent, or Firm* — William Park & Associates Ltd.

(57) ABSTRACT

Provided is a blankmask with a light-shielding layer including a light block layer and an anti-reflective layer, and a hard mask film. The light block layer and the anti-reflective layer are formed by combining a layer formed of a MoSi compound and a layer formed of a MoTaSi compound. Thus, the blankmask enables formation of a pattern of 32 nm or less, since the light-shielding layer can be thinly formed to a thickness of 200 to 700 and a photomask having pattern fidelity corresponding to the resolution of the pattern can be formed. The light-shielding layer has an optical density of 2.0 to 4.0 at an exposure wavelength of 193 nm, chemical resistance, and a sufficient process margin for defect repair. Further, the hard mask film is formed to a thickness of 20 to 50 using a compound including tin (Sn) and chromium (Cr), thereby decreasing an etch rate of the hard mask film. Accordingly, a resist film can be formed as a thin film, thereby manufacturing a high-resolution blankmask.

17 Claims, 2 Drawing Sheets

BLANKMASK AND METHOD FOR FABRICATING PHOTOMASK USING THE SAME

CROSS-REFERENCE TO RELATED APPLICATION

This application claims priority to and the benefit of Korean Patent Application No. 2012-0070772, filed on Jun. 29, 2012, the disclosure of which is incorporated herein by reference in its entirety.

BACKGROUND

1. Field of the Invention

The present invention relates to a blankmask and method for fabricating a photomask using the same, and more particularly, to a blankmask that can be formed to have a resolution of 32 nm or less and that has a pattern fidelity corresponding to the resolution, and a method of fabricating a photomask using the same.

2. Discussion of Related Art

Today, as the increasingly high integration density of large-scale integrated circuits (ICs) has been accompanied by the need for ever finer circuit patterns, semiconductor microfabrication process technology has emerged as a very important issue. In the case of a highly integrated circuit, circuit wires become finer for low power consumption and high-speed operation, and there is a growing need for a contact hole pattern for an interlayer connection and a circuit arrangement for high integration. In order to satisfy this demand, a technique of recording a finer circuit pattern requires manufacture of a photomask, belonging to the field of lithography.

In lithography, a binary-intensity blankmask using a light-shielding layer, and a phase-shift blankmask using a light-shielding layer and a phase-shift film, have been commercially used in order to improve the resolution of a semiconductor circuit pattern. Recently, a blankmask for a hardmask that includes a hard mask film and a light-shielding layer has been developed.

Conventionally, a blankmask for a hardmask has a structure in which a transparent substrate, a light-shielding layer, a hard mask film, and a resist film are sequentially stacked. A final photomask using the blankmask for a hardmask is obtained by forming a light-shielding layer pattern on a transparent substrate. In this case, the resist film is formed to a predetermined thickness since the resist film has selectivity with respect to a lower hard mask film, and the light-shielding layer has a thickness appropriate to secure a predetermined optical density (O.D.), a surface reflectivity feature, a chemical resistance, and a sufficient process margin for defect repair.

Recently, as patterns have become finer and denser, a photomask is required to be manufactured to have not only a high resolution but also precise critical dimension (CD) mean-to-target (MTT), CD uniformity, CD linearity, and pattern fidelity.

However, the following problems may occur when such a fine pattern is formed using a conventional blankmask for a hardmask.

A first problem is related to the thickness of the resist film. The thinner the resist film is, the higher the resolution of a pattern is. To form the resist film to a thin thickness, a time for etching the lower hard mask film is preferably short. However, when a material of a conventional hard mask film is used to form a high-resolution pattern, the time for etching the hard mask film becomes relatively long. Thus, it is difficult to form the resist film as a thin film. Even if a new material can be used instead, it is actually difficult to select a material that has not only selectivity (dry etch characteristics) with respect to the light-shielding layer below the resist film but also a least CD bias with respect to the light-shielding layer.

A second problem is related to pattern fidelity according to the thickness of the light-shielding layer. The light-shielding layer should have optical characteristics and durability (chemical resistance, exposure resistance, a sufficient defect repair margin, etc.) to manufacture a final photomask or perform wafer printing. Thus, the light-shielding layer is formed to a thick thickness so as to satisfy all of the above characteristics. However, recently, as patterns need to be finer to form high-resolution patterns, the light-shielding layer needs to be formed as a thin film. However, since the light-shielding layer should have not only light-shielding properties (optical density) capable of blocking incident light, but also chemical resistance, exposure resistance, a sufficient defect repair margin, etc., the light-shielding layer is very difficult to form as a thin film.

SUMMARY OF THE INVENTION

The present invention is directed to a blankmask in which a light-shielding layer is formed to a thin thickness so as to form a high-resolution pattern (e.g., a pattern of 32 nm or less) that has pattern fidelity corresponding to the resolution thereof, chemical resistance, and a sufficient process margin for defect repair, and that has improved critical dimension (CD) features, such as precise CD mean-to-target (MTT) matching a high resolution, CD uniformity, and CD linearity, and a photomask using the blankmask.

The present invention is also directed to a blankmask in which a hard mask film is formed of a new material capable of decreasing an etch rate thereof to form a resist film as a thin film, thereby enabling formation of a high-resolution pattern, and a photomask using the blankmask.

According to an aspect of the present invention, there is provided a blankmask including a light-shielding layer and a hard mask film on a transparent substrate. The hard mask film includes at least one among tin (Sn), chromium (Cr), and tantalum (Ta).

The hard mask film may include tin (Sn), chromium (Cr), or a combination thereof. The hard mask film may further include at least one metal selected from the group consisting of titanium (Ti), vanadium (V), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), cadmium (Cd), indium (In), hafnium (Hf), tungsten (W), osmium (Os), iridium (Ir), platinum (Pt), and gold (Au). In addition, the hard mask film may further include at least one material among oxygen (O), nitrogen (N), and carbon (C).

The hard mask film is formed of at least one among SnCON, SnON, SnCN, SnCO, SnO, SnC, SnN, Cr, CrCON, CrON, CrCN, CrCO, CrC, CrN, CrO, CrSn, CrSnCON, CrSnON, CrSnCN, CrSnCO, CrSnC, CrSnN, CrSnO, TaSn, TaSnCON, TaSnON, TaSnCN, TaSnCO, TaSnC, TaSnN, TaSnO, CrTaSnCON, CrTaSnON, CrTaSnCN, CrTaSnCO, CrTaSnO, CrTaSnC, and CrTaSnN.

The hard mask film has a thickness of 10 Å to 100 Å, and an etch rate of 0.6 Å/sec or more.

The light-shielding layer may include at least one metal and silicon (Si). The at least one metal may include at least one selected from the group consisting of titanium (Ti), vanadium (V), chronimum (Cr), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), cadmium (Cd), indium (In), tin (Sn), hafnium (Hf), tantalum (Ta), tungsten (W), osmium (Os), iridium (Ir), platinum (Pt), gold (Au), aluminum (Al), magnesium (Mg), lithium (Li), and selenium (Se). In addition, the light-shielding layer may further include at least one material among oxygen (O), nitrogen (N), and carbon (C).

The light-shielding layer may be formed as a single-layer film, a multilayer film including a light block layer and an anti-reflective layer, or a continuous film whose composition changes.

The light-shielding layer may include a MoSi compound, a MoTaSi compound, or a combination thereof when the light-shielding layer is formed as a single-layer film; and may include only the MoTaSi compound, only the MoSi compound, or a combination of a layer formed of the MoTaSi compound and a layer formed of the MoSi compound when the light-shielding layer is formed as a multilayer film including at least two layers.

The MoSi compound may include at least one among MoSi, MoSiCON, MoSiON, MoSiCN, MoSiCO, MoSiO, MoSiC, and MoSiN. The MoTaSi compound may include at least one among MoTaSi, MoTaSiCON, MoTaSiON, MoTaSiCN, MoTaSiCO, MoTaSiC, MoTaSiN, and MoTaSiO.

The MoTaSi compound may have a composition in which the content of Mo is 1 to 40 at %, the content of Ta is 1 to 40 at %, the content of Si is 30 to 80 at %, the content of nitrogen N is 0 to 50 at %, the content of oxygen is 0 to 20 at %, and the content of carbon C is 0 to 20 at %. The MoSi compound may have a composition in which the content of Mo is 1 to 40 at %, the content of Si is 40 to 80 at %, the content of nitrogen N is 0 to 50 at %, the content of oxygen is 0 to 20 at %, and the content of carbon C is 0 to 20 at %.

A composition ratio of Mo:Ta:Si included in a sputtering target used to form the MoTaSi compound may be 2 to 40 at %:2 to 40 at %:20 to 96 at %. A composition ratio of Mo:Si included in a sputtering target used to form the MoSi compound may be 5 to 40 at %:60 to 95 at %.

The light-shielding layer may have a thickness of 200 to 700, an optical density of 2.0 to 4.0, and a surface reflectivity of less than 50% at the exposure wavelength. A variation in a flatness of the light-shielding layer is less than 0.3 μm with respect to the transparent substrate.

Si/(Mo+Ta+N), which is a ratio of silicon (Si) to a composition of the light-shielding layer, may be 5.0 or less. Si/(Mo+N), which is a ratio of silicon (Si) to a composition of the light-shielding layer, may be 5.0 or less.

The blankmask may further include a resist film formed on the hard mask film. The resist film may have a thickness of 300 Å to 1,500 Å.

The blankmask may further include an etch stopping film disposed between the transparent substrate and the light-shielding layer.

The light-shielding layer may be thermally treated at 200° C. to 500° C.

According to another aspect of the present invention, there is provided a blankmask including a light-shielding layer and a hard mask film on a transparent substrate. The light-shielding layer includes MoTaSi compound, and the hard mask film includes chromium (Cr). In this case, the hard mask film includes at least one among Cr, CrCON, CrON, CrCN, CrCO, CrC, CrN, and CrO.

According to another aspect of the present invention, there is provided a blankmask including a light-shielding layer and a hard mask film on a transparent substrate. The light-shielding layer includes a MoTaSi compound, and the hard mask film includes chromium (Cr) and tin (Sn). The hard mask film includes one among CrSn, CrSnCON, CrSnON, CrSnCN, CrSnCO, CrSnC, CrSnN, and CrSnO. The hard mask film has a composition in which the content of Cr is 30 to 99 at %, the content of Sn is 1 to 30 at %, the content of oxygen is 0 to 50 at %, the content of nitrogen N is 0 to 50 at %, and the content of carbon C is 0 to 20 at %. The hard mask film is formed using a Cr target and a Sn target, or using a CrSn target. The composition ratio of Cr:Sn in the CrSn target is 99 at % to 60 at %:1 at % to 40 at %.

According to another aspect of the present invention, there is provided a method of manufacturing a photomask, the method including preparing a blankmask in which a light-shielding layer and a hard mask film are sequentially stacked on a transparent substrate, forming a resist film on the hard mask film, forming a resist film pattern by exposing and developing the resist film, etching the hard mask film using the resist film pattern as a mask; and etching the light-shielding layer using the etched hard mask film as a mask.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, exemplary embodiments of the present invention will be described more fully with reference to the accompanying drawings. The present invention may, however, be embodied in many different forms and should not be construed as limited to the embodiments set forth herein. Rather, these embodiments are provided so that this disclosure will be thorough and complete and will fully convey the concept of the invention to those of ordinary skill in the art. It will be obvious to those of ordinary skill in the art that the scope of the invention covers all modifications, equivalents, and alternatives falling within the scope of appended claims. Accordingly, it will be understood that various changes in form and details may be made therein without departing from the spirit and scope of the invention as defined by the appended claims.

Figure 1:
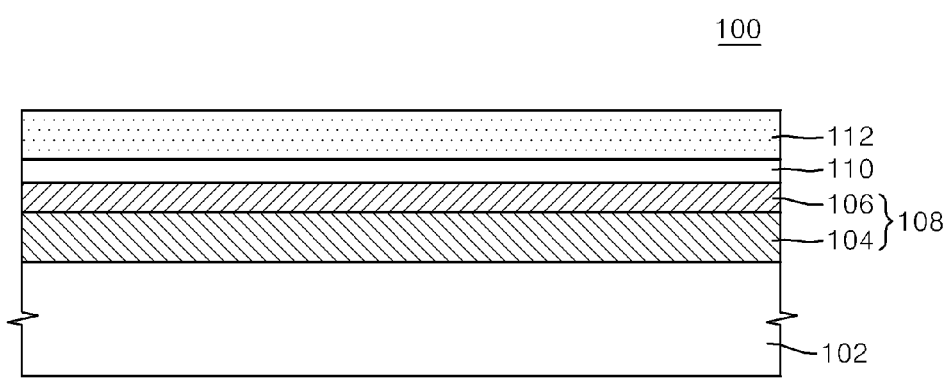
FIG. 1 is a cross-sectional view of a blankmask according to one embodiment of the present invention.

FIG. 1 is a cross-sectional view of a blankmask 100 according to one embodiment of the present invention.

Referring to FIG. 1, the blankmask 100 includes a transparent substrate 102, and a light-shielding layer 108, a hard mask film 110, and a resist film 112 that are sequentially disposed on the transparent substrate 102.

The transparent substrate 102 may be formed of quartz glass, synthetic quartz glass, or fluorine-doped quartz glass that is six inches long. In the transparent substrate 102, a maximum birefringence is controlled to be 2 nm/6.35 mm or less within a plane thereof, and a total-indicated-reading (TIR) value of the flatness of a plane on which films are formed is controlled to be 0.3 μm or less.

The light-shielding layer 108 may be formed as a single-layer film having both a light-shielding property and an anti-reflective property, may be formed as a multi-layer film having at least a light block layer 104 and an anti-reflective layer 106, or may be formed as a continuous film whose composition changes.

The light-shielding layer 108 may be formed, for example, by physical/chemical deposition. When the light-shielding layer 108 is formed by physical deposition, a direct-current (DC) magnetron reactive sputtering device may be used. A thin film may be formed according to a sputtering method using a single target or a co-sputtering method in which a plurality of targets are simultaneously formed.

The light-shielding layer 108 has a thickness of 200 to 700, an optical density of 2.0 to 4.0 with respect to exposure light, and a table surface reflectivity of 15 to 50%. A variation in the flatness of the light-shielding layer 108 is 0.3 µm or less with respect to the transparent substrate 102. Pattern registration is influenced by variation in the flatness of the light-shielding layer 108 during manufacture of a photomask, and a CD is influenced by variation in the flatness of the light-shielding layer 108 when a high-precision and high-resolution pattern is formed. Thus, when the light-shielding layer 108 is formed, a variation in the flatness thereof is preferably controlled to be 0.3 µm or less with respect to the transparent substrate 102. In addition, the degree of the flatness is preferably the same as those of the transparent substrate 102 and the light-shielding layer 108.

The light-shielding layer 108 includes at least one metal selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), tungsten (W), iron (Fe), gallium (Ga), germanium (Ge), ruthenium (Ru), rhodium (Rh), silver (Ag), indium (In), tin (Sn), osmium (Os), iridium (Ir), platinum (Pt), and gold (Au). The light-shielding layer 108 may further include at least one material among silicon (Si), nitrogen (N), oxygen (O), and carbon (C).

In particular, when the light-shielding layer 108 is formed to a thin thickness, the light-shielding layer 108 may include a MoSi compound and a MoTaSi compound to have a light-shielding property, chemical resistance, and a sufficient process margin for defect repair. For example, when the light-shielding layer 108 is formed as a two-layer structure, a lower layer may be a light block layer and an upper layer may be an anti-reflective layer. In this case, the lower and upper layers may be formed of the MoTaSi compound and the MoSi compound, respectively, both the upper and lower layers may be formed of the MoTaSi compound or the MoSi compound, or the lower and upper layers may be formed of the MoSi compound and the MoTaSi compound, respectively. That is, the light-shielding layer 108 may have any of various structures.

The MoTaSi compound may include at least one among MoTaSi, MoTaSiCON, MoTaSiON, MoTaSiCN, MoTaSiCO, MoTaSiC, MoTaSiN, and MoTaSiO. The MoSi compound may include at least one among MoSi, MoSiCON, MoSiON, MoSiCN, MoSiCO, MoSiO, MoSiC, and MoSiN.

The light-shielding layer 108 may be formed of only MoTaSi, or two types of sputtering targets including MoTaSi and MoSi. In detail, the MoTaSi target preferably has a composition in which Mo:Ta:Si=2 to 40 at %:2 to 40 at %:20 to 96 at %. The MoSi target preferably has a composition in which Mo:Si=5 to 40 at %:60 to 95 at %. In the case of the MoTaSi target, when the contents of Mo and Ta are each 2 at % or less, plasma for sputtering the target including MoTaSi may be unstably generated. When the contents of Mo and Ta are each 40 at % or more, the light-shielding layer 108 has poor chemical resistance and low selectivity with respect to the hard mask film 110. In the case of the MoSi target, the light-shielding layer 108 has poor chemical resistance when the content of Mo is 40 at % or more, and plasma is unstably generated during sputtering when the content of Mo is 5 at % or less, similar to the MoTaSi target.

When the light-shielding layer 108 is a single-layer film including the MoTaSi compound, the MoTaSi compound may have a composition in which the content of Mo is 1 to 40 at %, the content of Ta is 1 to 40 at %, the content of Si is 30 to 80 at %, the content of nitrogen N is 0 to 50 at %, the content of oxygen is 0 to 20 at %, and the content of carbon C is 0 to 20 at %. When the light-shielding layer 108 is a single-layer film including the MoSi compound, the MoSi compound may have a composition in which the content of Mo is 1 to 40 at %, the content of Si is 40 to 80 at %, the content of nitrogen N is 0 to 50 at %, the content of oxygen O is 0 to 20 at %, and the content of carbon C is 0 to 20 at %.

When the light-shielding layer 108 is a multi-layer film including at least two layers, e.g., the light block layer 104 and the anti-reflective layer 106, the light-shielding layer 108 may be formed of only the MoSi compound or the MoTaSi compound, or may be formed using a combination of a layer formed of the MoTaSi compound and a layer formed of the MoSi compound. In this case, the MoTaSi compound may have a composition in which the content of Mo is 1 to 40 at %, the content of Ta is 1 to 40 at %, the content of Si is 30 to 80 at %, the content of nitrogen N is 0 to 50 at %, the content of oxygen O is 0 to 20 at %, and the content of carbon C is 0 to 20 at %. Also, the MoSi compound may have a composition in which the content of Mo is 1 to 40 at %, the content of Si is 40 to 80 at %, the content of nitrogen N is 0 to 50 at %, the content of oxygen O is 0 to 20 at %, and the content of carbon C is 0 to 20 at %.

When the light-shielding layer 108 is a multi-layer film including more than one layer to secure a sufficient defect repair margin and a ratio of silicon (Si) to the composition of the light-shielding layer 108 is defined as 'the content (at %) of Si divided by the contents (at %) of all materials except for Si', the ratio is preferably '5' or less. This is to prevent undesired pattern damage from occurring due to reaction of silicon (Si) and fluorine (F) gas included in $XeF_2$ gas used in performing defect repair on the light-shielding layer 108. When the ratio of silicon (Si) to the composition of the light-shielding layer 108 is '5' or less, the occurrence of pattern damage during the defect repair may be minimized. The ratio of silicon (Si) is more preferably '4' or less to secure a sufficient defect repair margin.

After the light-shielding layer 108 is formed, the light-shielding layer 108 may be thermally treated at 200 to 500 using a well-known thermal treatment apparatus (vacuum rapid thermal process apparatus) and method.

The hard mask film 110 has a thickness of 10 to 100 and preferably, a thickness of 20 to 50, and has an etch rate of 0.6/sec or more.

To increase the etch rate of the hard mask film 110, the hard mask film 110 may preferably include a tin (Sn) compound, a chromium (Cr) compound, or a chromium-tin (CrSn) compound. Otherwise, the hard mask film 110 may be formed of a tantalum (Ta) compound having similar physical properties to chromium (Cr).

The hard mask film 110 may further include at least one metal selected from the group consisting of titanium (Ti), vanadium (V), cobalt (Co), nickel (Ni), zirconium (Zr), niobium (Nb), palladium (Pd), zinc (Zn), aluminum (Al), manganese (Mn), cadmium (Cd), magnesium (Mg), lithium (Li), selenium (Se), copper (Cu), molybdenum (Mo), hafnium (Hf), tungsten (W), iron (Fe), gallium (Ga), germanium (Ge), ruthenium (Ru), rhodium (Rh), silver (Ag), indium (In), osmium (Os), iridium (Ir), platinum (Pt), and gold (Au). The hard mask film 110 may further include at least one material among nitrogen (N), oxygen (O), and carbon (C).

The hard mask film 110 may be preferably formed of at least one selected from the group consisting of SnCON, SnON, SnCN, SnCO, SnO, SnC, SnN, Cr, CrCON, CrON, CrCN, CrCO, CrC, CrN, CrO, CrSn, CrSnCON, CrSnON, CrSnCN, CrSnCO, CrSnC, CrSnN, CrSnO, TaSn, TaSnCON, TaSnON, TaSnCN, TaSnCO, TaSnC, TaSnN, TaSnO, CrTaSnCON, CrTaSnON, CrTaSnCN, CrTaSnCO, CrTaSnO, CrTaSnC, and CrTaSnN. For example, when the hard mask film 110 is formed of a chromium-tin (CrSn) compound, the chromium-tin (CrSn) compound has a composition in which the content of Cr is 30 to 99%, the content of Sn is 1 to 30%, the content of O is 0 to 50 at %, the content of N is 0 to 50 at %, and the content of C is 0 to 20 at %. In this case, the hard mask film 110 is formed using either a Cr target and a Sn target, or a CrSn target, and a composition ratio of Cr:Sn in the CrSn target is 99 at % to 60 at %:1 at % to 40 at %.

The etch selectivity of the light-shielding layer 108 to the hard mask film 110 is 1:15 or more with respect to a material used to etch the light-shielding layer 108. After the hard mask film 110 is formed, the hard mask film 110 may be selectively thermally treated. In this case, the light-shielding layer 108 may be thermally treated at a temperature that is less than or equal to a thermal treatment temperature of the light-shielding layer 108.

The resist film 112 may be, for example, a chemically amplified resist film, and may have a thickness of 300 to 1,500. The resist film 112 may be formed by spin coating or scan-spin coating. The resist film 112 may include an organic film formed of an organic material containing acid (H+) at a bottom thereof to control scum or the like between the resist film 112 and the hard mask film 110. The organic film is dissolved in 2.38% tetramethyl ammonium hydroxide (TMAH), which is a developing solution, during forming of a pattern, and has a thickness of 100 or less, and preferably, a thickness of 50 or less. Thus, since a chemically amplified resist may be prevented from being neutralized by acid (H+) due to the organic film, the occurrence of scum may be reduced, thereby enabling formation of a high-quality pattern.

Furthermore, although not shown, the blankmask 100 according to an embodiment of the present invention may further include a phase-shift film if needed.

The blankmask 100 may further include an etch stopping film formed in consideration of an etch selectivity between the transparent substrate 102 and the light-shielding layer 108.

EXAMPLES

Method of Manufacturing a Blankmask for a Hardmask

In the blankmask 100 for a hardmask, the light-shielding layer 108 and the hard mask film 110 were formed using a DC magnetron reactive sputtering device. A sputtering process was performed using at least one gas selected from the group consisting of argon (Ar), nitrogen (N), nitrogen monoxide (NO), carbon dioxide ($CO_2$), methane ($CH_4$), helium (He), and nitrogen dioxide ($NO_2$).

First, the light-shielding layer 108 having a two-layer structure including the light block layer 104 and the anti-reflective layer 106 was formed on the transparent substrate 102 formed of synthetic quartz glass having a size of 6025 (6×6×0.25 inches). Specifically, the light block layer 104 formed of MoTaSiN was formed on the transparent substrate 102 by performing a film forming process with process power of 0.6 kW for 250 seconds by using a MoTaSi target (Mo:Ta:Si=20 at %:30 at %:50 at %) as a sputtering target and a process gas having a composition ratio of Ar:$N_2$=8 sccm:2 sccm. Measurement of the optical density, reflectivity, and thickness of the light block layer 104 using the n&k Analyzer and XRR equipment revealed that the light block layer 104 had an optical density of 2.65 at an exposure wavelength of 193 nm, a reflectivity of 56%, and a thickness of 255.

Then, the anti-reflective layer 106 formed of MoTaSiN was formed to a thickness of 40 on the light block layer 104 by performing a film forming process with process power of 0.7 kW for 25 seconds by using a MoTaSi target having a different composition ratio (Mo:Ta:Si=5 at %:5 at %:90 at %) from the target for forming the light block layer 198, as a sputtering target, and a process gas having a composition ratio of Ar:$N_2$=8.0 sccm:8.5 sccm. After the anti-reflective layer 106 was formed, measurement of the optical density, reflectivity, and thickness of the light-shielding layer 108 including the light block layer 104 and the anti-reflective layer 106 revealed that the light-shielding layer 108 had an optical density of 2.84 at an exposure wavelength of 193 nm, a reflectivity of 38.5%, and a thickness of 295, thereby completing formation of the light-shielding layer 108 having a thin thickness.

Then, the light-shielding layer 108 was thermally treated at 350 for 10 minutes by using a vacuum rapid thermal process device.

Then, the hard mask film 110 formed of CrSnON was formed to a thickness of 30 on the light-shielding layer 108 by performing a film forming process with process power of 0.62 kW for 50 seconds by using a CrSn target (Cr:Sn=90 at %:10 at %) and a process gas having a composition ratio of Ar:$N_2$:NO=5 sccm:3 sccm:8 sccm.

Then, the resist film 112 was formed to a thickness of 700 by applying a chemically amplified resist on the hard mask film 110 by spin coating, thereby completing the blankmask 100 for a hardmask.

Method of Manufacturing a Photomask Using a Blankmask for a Hardmask

Figure 2:
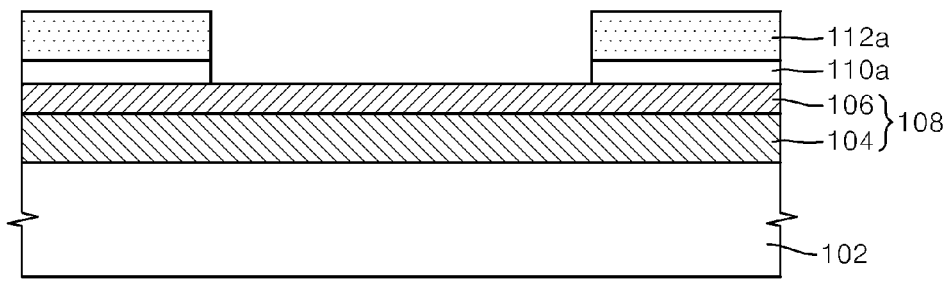
FIGS. 2 to 4 are cross-sectional views illustrating a method of manufacturing a photomask according to an embodiment of the present invention.
Figure 3:
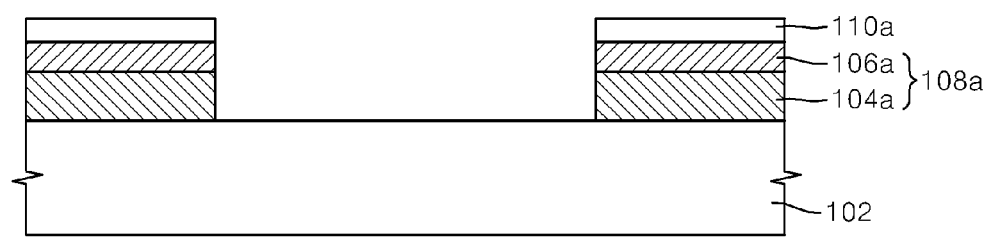
Figure 4:
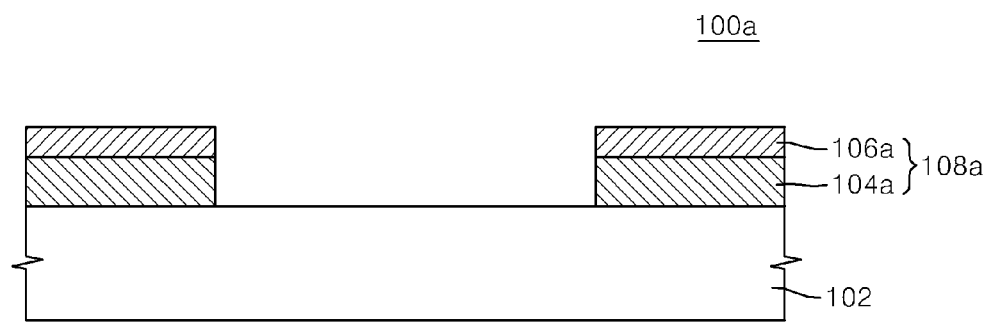

FIGS. 2 to 4 are cross-sectional views illustrating a method of manufacturing a photomask according to an embodiment of the present invention.

An exposure process was performed on the blankmask 100 for a hardmask described above using an E-beam exposure device that uses an acceleration voltage of 50 keV, and a post exposure baking (PEB) process was performed at 110 for ten minutes. Then, the resist film pattern 112a was formed using a developing solution as described above with reference to FIG. 2.

Then, a hard mask film pattern 110a was formed by patterning the hard mask film 110 below the resist film pattern 120a, using chlorine (Cl2) gas, and using the resist film pattern 112a as an etch mask. In this case, an etch rate of the hard mask film 110 was analyzed using an end point detection (EPD) device and found to be 2.0/sec. After the hard mask film pattern 110a was formed, the thickness of the remaining resist film 112 was detected to be 335 as a result of measuring the thickness of the remaining resist film 112 using an atomic force microscope (AFM). Thus, there was no problem forming a pattern.

Then, the resist film pattern 112a was removed, and a light-shielding layer pattern 108a including a light block layer pattern 104a and an anti-reflective layer pattern 106a was formed by patterning the light-shielding layer 108 below the resist film pattern 112a using fluorine (F) gas and the hard mask film pattern 110a as an etch mask, as described above with reference to FIG. 3. After the light-shielding layer pattern 108a was formed, the thickness of the hard mask film pattern 110a was measured to be 29. Accordingly, the degree of selectivity of the hard mask film pattern 110a was determined to be appropriate.

Then, the hard mask film pattern 110a was removed to complete manufacture of a photomask 100a as illustrated in FIG. 4.

As a result of evaluating CD features of the final photomask 100a with respect to the hard mask film 110 by using a CD-scanning electron microscope (SEM), a CD bias of the light-shielding layer 108 was preferably 0.1 nm compared to the hard mask film 110, and a scattering pattern was developed to 40 nm. Also, as a result of measuring the CD linearity of the final photomask 100a in a range of 60 nm to 1 μm, an Iso-line was 2.0 nm, a line-and-space pattern was 2.5 nm, an Iso-space pattern was 4.2 nm. Also, as a result of measuring a through-pitch based on a line-and-space pattern of 100 nm while setting a pitch size to range from 70 nm to 1 μm, a pitch uniformity (Max−Min) was 3.1 nm, thereby obtaining a high-quality pattern that hardly showed the loading effect.

Also, in order to check a defect repair margin of the light-shielding layer 108, the light-shielding layer 108 was repaired using $XeF_2$ gas and a harsh purging process was additionally performed on the light-shielding layer 108 for 120 seconds. As a result, no pattern damage was detected. Also, although a one-cycle process using 120 ppm of ozone water, sulfuric acid, and a rinse that are used in a cleaning process was repeatedly performed five times, a variation in a CD was measured to be 0.5 nm, which is a desirable result.

The following examples are exemplary embodiments of the present invention based on a method of manufacturing a photomask using a blankmask for a hardmask. In these examples, a thin film including MoSi and a thin film including MoTaSi were evaluated.

Evaluation of Physical Properties of MoSi-Based Light-Shielding Layer

In examples 1 to 6, a light-shielding layer was formed of MoSiN using a MoSi target, and the thickness, chemical resistance, a defect repair margin, etc. of the light-shielding layer were evaluated according to the composition of the target. The evaluation was performed to minimize the thickness of the light-shielding layer while still providing the needed chemical resistance, defect repair margin, etc. of the MoSi-based light-shielding layer. The evaluation was performed on a light block layer that is a lower layer among two layers that constitute the light-shielding layer, since the light block layer is relatively thicker than an anti-reflective layer that is an upper layer of the light-shielding layer. The light block layer was formed as a MoSiN thin film, based on the blankmask for a hardmask described above and by using a process gas having a composition ratio of (Ar:$N_2$=8 sccm:2 sccm) and process power of 0.6 kW, and setting an initial optical density to range from 2.70 to 2.72 at an exposure wavelength of 193 nm, as illustrated in Table 1.

TABLE 1

| [Evaluation of chemical resistance according to composition of MoSi target] | | | | | | |
|---|---|---|---|---|---|---|
| | Example 1 | Example 2 | Example 3 | Example 4 | Example 5 | Example 6 |
| Composition ratio of target (Mo:Si) (at %) | 20:80 | 30:70 | 5:95 | 10:90 | 40:60 | 50:50 |
| Material | MoSiN | MoSiN | MoSiN | MoSiN | MoSiN | MoSiN |
| Thickness ( ) | 395 | 355 | 455 | 425 | 320 | 285 |
| Evaluation of chemical resistance (variation in optical density) | 0.021 | 0.032 | 0.018 | 0.020 | 0.152 | 0.320 |
| Variation in defect repair @ AIMS | <5% | <5% | 15% | 8% | <5% | <5% |

Table 1 shows results of evaluating the thickness and chemical resistance of the light block layer and defect repair performed on the light block layer, according to the composition of the MoSi target, when the light block layer was formed. The evaluation results reveals that the thickness of the light block layer decreased as the content of Mo included in the composition of the MoSi target in the same range of optical density of 2.7 to 2.72 increased. In contrast, the chemical resistance of the light block layer worsened as the relative content of Mo increased (or, as the relative content of Si decreased). A repair feature margin for the light block layer worsened as the content of Mo decreased.

With respect to the repair features, a ratio of Si, Mo, and nitrogen (N) was additionally measured through an AES composition analysis, as follows:

TABLE 2

[Results of AES-analyzing materials of MoSi target and comparing ratio of Si]

|  | Example 1 | Example 2 | Example 3 | Example 4 | Example 5 | Example 6 |
|---|---|---|---|---|---|---|
| Composition ratio of target (Mo:Si) (at %) | 20:80 | 30:70 | 5:95 | 10:90 | 40:60 | 50:50 |
| Composition ratio (Mo:Si:N) (at %) | 13:75:12 | 18:67:15 | 4:84:12 | 8:82:10 | 22:64:14 | 28:57:15 |
| Si/(Mo + N) Ratio | 3.00 | 2.03 | 5.25 | 4.56 | 1.78 | 1.33 |
| Repair Margin | <5% | <5% | 15% | 8% | <5% | <5% |

Table 2 shows a result of analyzing the composition of a thin film according to each of Examples 1 to 6 using AES equipment, and comparing a ratio of Si to the composition, i.e., Si/(Mo+N). As a result, in Examples 3 and 4 in which a process margin for defect repair was insufficient, the ratio of Si/(Mo+N) was '4' or more. In particular, in Example 3, the ratio of Si/(Mo+N) was '5.25' which means that a binding state of Si is high. This indicates that damage occurred in a repair purging process due to reaction of silicon (Si) and fluorine (F) when $XeF_2$ gas was purged.

In the repair process, in order to additionally evaluate the repair margin, a repair evaluation was performed while changing a gas ratio as follows, when the light block layer was formed.

TABLE 3

[Results of evaluating repair features according to gas ratio]

|  | Example 7 | Example 8 | Example 9 | Example 10 | Example 11 | Example 12 |
|---|---|---|---|---|---|---|
| Composition ratio of target (Mo:Si) (at %) | 10:90 | 10:90 | 10:90 | 10:90 | 10:90 | 10:90 |
| Process gas (Ar:$N_2$) (sccm) | 7:3 | 6:4 | 5:5 | 4:6 | 9:1 | 10:0 |
| Thickness ( ) | 445 | 472 | 497 | 525 | 396 | 381 |
| Composition ratio (Mo:Si:N) (at %) | 8:77:15 | 8:73:19 | 8:69:23 | 7:67:26 | 7:85:8 | 8:92:0 |
| Si/(Mo + N) Ratio | 3.35 | 2.70 | 2.26 | 2.03 | 5.67 | 11.5 |
| Repair Margin | <5% | <5% | <5% | <5% | 18% | 35% |

Table 3 shows results of analyzing the composition ratio of the light block layer according to the gas ratio using a MoSi target (Mo:Si=10 at %:90 at %), a ratio of Si/Mo+N, and a repair margin thereof, when the light block layer was formed. The results reveal that the thickness of the light block layer increased at the same optical density as the ratio of nitrogen ($N_2$) gas increased, and the composition was influenced more by a variation in the contents of Si and nitrogen (N) than a variation in the content of Mo. Also, in Examples 7 to 10, the ratio of Si/(Mo+N) was less than 4.0 and a variation thereof was preferably 5% or less after repair purging was performed, whereas in Examples 11 and 12, the ratio of Si/(Mo+N) was 4.0 or more and a repair margin was difficult to secure.

As described above, as a result of evaluating the light block layer formed of the MoSi compound, the chemical resistance of the light block layer worsened as the content of Mo increased, and the repair margin was secured only when the ratio of Si/(Mo+N) was 4 or more.

Based on the results of the Examples described above, an anti-reflective layer was formed using the MoSi target (Mo:Si is 10 at %:90 at %) related to Examples 1, 2, 7, 8, 9, and 10 in which thin film features were satisfied, as follows.

thickness of the light-shielding layer, an additional experiment was performed to form a MoTaSi-based light-shielding layer, as follows.

Evaluation of Physical Properties of MoTaSi-Based Light-Shielding Layer

Here, a light-shielding layer was formed using a MoTaSi target and was then evaluated. A process of forming the MoTaSi-based light-shielding layer was performed under the same conditions as the film-forming process using the MoSi target.

TABLE 5

[Evaluation of chemical resistance and repair according to the composition of MoTaSi target]

| | Example 19 | Example 20 | Example 21 |
|---|---|---|---|
| Target composition ratio (Mo:Ta:Si) at % | 10:10:80 | 10:20:70 | 10:30:60 |
| Material | MoTaSiN | TaSiN | TaSiN |
| Thickness | 385 | 345 | 305 |
| Evaluation of chemical resistance (variation in optical density) | 0.015 | 0.016 | 0.015 |
| Composition ratio (Mo:Ta:Si:N) | 5:8:73:12 | 5:13:68:14 | 5:15:67:13 |
| Si/(Mo + Ta + N) | 2.92 | 2.13 | 2.03 |
| Variation @ AIMS | <5% | <5% | <5% |

TABLE 4

[MoSi-based anti-reflective layer and evaluation of light-shielding layer using the same]

| | Example 13 (Example 1) | Example 14 (Example 2) | Example 15 (Example 7) | Example 16 (Example 8) | Example 17 (Example 9) | Example 18 (Example 10) |
|---|---|---|---|---|---|---|
| Process gas for anti-reflective layer (Ar:$N_2$) (sccm) | 8.0:8.5 ($N_2$: 51%) | 8.0:8.5 ($N_2$: 51%) | 8.0:8.5 ($N_2$: 51%) | 8.0:8.5 ($N_2$: 51%) | 8.0:8.5 ($N_2$: 51%) | 8.0:8.5 ($N_2$: 51%) |
| Final thickness ( ) of light-shielding layer | 435 | 395 | 485 | 512 | 537 | 565 |
| Optical density of light-shielding layer (@193 nm) | 2.83 | 2.82 | 2.80 | 2.81 | 2.82 | 2.83 |
| Reflectivity (%) of light-shielding layer (@193 nm) | 37.5 | 38.2 | 34.2 | 31.3 | 27.5 | 24.8 |

Table 4 shows features of the final light-shielding layer including a MoSiN-based anti-reflective layer using a MoSi material. In the Examples, the thickness of the final light-shielding layer ranged from 435 to 565 and was thus thinner than a conventional light-shielding layer having a thickness of about 700. Furthermore, both the optical density and the reflectivity thereof had ranges that allow wafer printing to be performed.

However, when a MoSi-based material was used, the light-shielding layer had poor chemical resistance and was thus formed to a minimum thickness of 435. Thus, to minimize the TABLE 5-continued

[Evaluation of chemical resistance and repair according to the composition of MoTaSi target]

|  | Example 22 | Example 23 | Example 24 |
|---|---|---|---|
| Target composition ratio (Mo:Ta:Si) at % | 20:30:50 | 30:30:40 | 40:40:20 |
| Material | MoTaSiN | MoTaSiN | MoTaSiN |
| Thickness | 272 | 253 | 248 |
| Evaluation of chemical resistance (variation in optical density) | 0.018 | 0.023 | 0.058 |
| Composition ratio (Mo:Ta:Si:N) | 8:14:63:15 | 12:15:59:14 | 18:20:47:15 |
| Si/(Mo + Ta + N) | 1.70 | 1.44 | 0.89 |
| Variation @ AIMS | <5% | <5% | <5% |

Table 5 shows results of forming a light block layer using a MoTaSi target, evaluating chemical resistance and defect repair, and an AES composition analysis performed on the light block layer, according to the composition of the light block layer.

According to these Examples, the chemical resistance that was poor when the light-shielding layer was formed using the MoSi target, was high since the content of silicon (Si) included in the MoTaSi target was 40 at % or more. Furthermore, the light block layer was formed as a thin film having about 250.

Also, a ratio of Si/(Mo+Ta+N) was less than 4.0 in all the above Examples, and a sufficient repair margin was thus secured. However, in the light block layer in Example 15, as the content of silicon (Si) was low, i.e., 50 at %, damage was caused by chlorine (Cl) gas when a hard mask film was etched.

An anti-reflective layer was formed on the light block layer in Examples 19 to 23 using a MoTaSi target (Mo:Ta:Si=5 at %:5 at %:90 at %), and a final light-shielding layer was formed and evaluated as shown in Table 6 below.

TABLE 6

[Evaluation of MoTaSi-based light-shielding layer]

|  | Example 25 (Example 19) | Example 26 (Example 20) | Example 27 (Example 21) | Example 28 (Example 22) | Example 29 (Example 23) |
|---|---|---|---|---|---|
| Process gas of anti-reflective layer (Ar:N$_2$) (sccm) | 8.0:8.5 (N$_2$: 51%) | 8.0:8.5 (N$_2$: 51%) | 8.0:8.5 (N$_2$: 51%) | 8.0:8.5 (N$_2$: 51%) | 8.0:8.5 (N$_2$: 51%) |
| Final thickness of light shielding layer ( ) | 425 | 385 | 345 | 312 | 293 |
| Optical density of light shielding layer (@193 nm) | 2.82 | 2.82 | 2.80 | 2.81 | 2.81 |
| Reflectivity (%) of light-shielding layer (@193 nm) | 36.5 | 37.3 | 38.5 | 38.1 | 39.7 |

Table 6 shows results of evaluating a final light-shielding layer formed of a MoTaSi compound. As a result of the evaluation, in the case of the MoTaSi-based light-shielding layers in these Examples, the optical density was 2.80 or more, and the thickness ranged from 293 to 425 (which is remarkably thinner than when the MoSi compound was used in the previous Examples). Also, the reflectivity was less than 40%.

Furthermore, in Example 30, a light-shielding layer having a two-layer structure including a light block layer formed of a MoTaSi target (Mo:Ta:Si=40 at %:40 at %:40 at %) and an anti-reflective layer formed of a MoSi target (Mo:Si=10 at %:90 at %) was formed and evaluated. In this case, the light block layer was formed under the same conditions as in Example 23, and the anti-reflective layer was formed under the same conditions as in Example 13. As a result, the light-shielding layer had an optical density of 2.80 at an exposure wavelength of 193 nm, the reflectivity of 35.5%, and the thickness of 425. Thus, the features of the light-shielding layer were desirable.

Evaluation of Physical Properties of Hard Mask Film

In following Examples of the present invention, in order to decrease an etch rate of a hard mask film, the hard mask film was formed while changing materials and process conditions. Then, the etch rate was evaluated using TETRA-X dry etching equipment, and an etching time was evaluated using an EPD device. Results of evaluating the etch rate are shown in Table 7 below.

TABLE 7

| [Evaluation of etching features of hard mask film according to materials thereof] | | | | | | | |
|---|---|---|---|---|---|---|---|
| | Example 31 | Example 32 | Example 33 | Example 34 | Example 35 | Example 36 | Example 37 | Example 38 |
| Target composition ratio (Cr:Sn) (at %) | Cr 100:0 | Cr 100:0 | Cr 100:0 | Cr 100:0 | Cr 100:0 | CrSn 90:10 | CrSn 80:20 | CrSn 80:20 |
| Material | CrN | CrON | CrON | CrON | CrON | CrSnON | CrSnON | CrSnN |
| Process gas (Ar:N$_2$:NO) (sccm) | 5:3:0 | 5:0:8 | 5:0:14 | 5:0:20 | 5:3:20 | 5:3:14 | 5:3:14 | 5:8:0 |
| Thickness ( ) | 30 | 30 | 30 | 30 | 30 | 30 | 30 | 20 |
| Etch Rate (/sec) | 1.0 | 1.3 | 1.6 | 1.7 | 1.74 | 2.0 | 2.3 | 1.9 |
| PR thickness ( ) | 1500 to 800 | ~700 | ~500 | ~500 | ~500 | ~400 | ~400 | ~400 |

Table 7 shows results of evaluating the etch rate of the hard mask film according to materials thereof. The evaluation results reveal that if the hard mask film was formed using Cr, the etch rate increased within a range of 1.3/sec to 1.74/sec when the hard mask film contained NO gas, compared to when the hard mask film contained nitrogen (N). However, in Examples 34 and 35, as the reactivity of NO gas saturated, the etch rate was also saturated. In Examples 36 and 37, when the hard mask film was formed using CrSn, the etch rate increased within a range of 2.0/sec to 2.3/sec. Thus, when a CrSn compound was used, an upper resist film may be formed as a thin film having a thickness of 400.

As described above, according to the present invention, a light-shielding layer is formed to a thin thickness by combining a MoSi compound layer and a MoTaSi compound layer. Thus, a pattern of 32 nm or less, and particularly, a pattern of 20 nm or less can be formed, and a blankmask having pattern fidelity corresponding to the resolution of the pattern and a photomask using the blankmask can be formed. Also, the light-shielding layer has an optical density of 2.0 to 4.0 at an exposure wavelength of 193 nm, has chemical resistance and a sufficient process margin for the defect repair, has CD features such as precise CD MTT, CD uniformity, and CD linearity due to a high-resolution thereof, and has pattern fidelity.

Also, according to the present invention, a hard mask film is formed using a compound including tin (Sn) and chromium (Cr), thereby decreasing the etch rate of the hard mask film. Thus, a resist film can be formed as a thin film, and a high-resolution photomask can thus be formed.

Also, according to the present invention, a hard mask film is formed using a compound including tin (Sn) and chromium (Cr), thereby decreasing the etch rate of the hard mask film. Thus, a resist film can be formed as a thin film, and a high-resolution blankmask and a photomask using the blankmask can thus be formed.

Also, according to the present invention, a light-shielding layer is formed to a thin thickness by combining a MoSi compound layer and a MoTaSi compound layer. Thus, a pattern of 32 nm or less can be formed, and a blankmask having pattern fidelity corresponding to the resolution of the pattern and a photomask using the blankmask can be formed.

Also, according to the present invention, a light-shielding layer is formed by combining a MoSi compound layer and a MoTaSi compound layer. Thus, a blankmask having an optical density of 2.0 to 4.0 at an exposure wavelength of 193 nm, having chemical resistance and a sufficient process margin for the defect repair, and having CD features such as precise CD MTT, CD uniformity, and CD linearity due to a high-resolution thereof, and having pattern fidelity, and a photomask using the blankmask, can be manufactured.

Thus, according to the present invention, a minimum CD of 32 nm or less can be formed, thereby enabling formation of a blankmask that can be applied to 193 nm ArF lithography, liquid immersion lithography, and double patterning lithography. And a photomask using the blankmask can be provided.

While this invention has been particularly shown and described with reference to exemplary embodiments thereof, it will be understood by those of ordinary skill in the art that the present invention is not limited by the exemplary embodiments and various changes in form and details may be made therein without departing from the spirit and scope of the invention as defined by the appended claims.

What is claimed is:

1. A blankmask which includes a light-shielding layer and a hard mask film on a transparent substrate, wherein the hard mask film comprises at least one among tin (Sn), chromium (Cr), and tantalum (Ta), wherein a thickness of the hard mask film is 10 Å to 100 Å, and an etch rate of the hard mask film is 0.6 Å/sec or more.

2. The blankmask of claim 1, wherein the hard mask film further comprises at least one material among oxygen (O), nitrogen (N), and carbon (C).

3. The blankmask of claim 1, wherein the hard mask film further comprises at least one metal selected from the group consisting of titanium (Ti), vanadium (V), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), cadmium (Cd), indium (In), hafnium (Hf), tungsten (W), osmium (Os), iridium (Ir), platinum (Pt), and gold (Au); and selectively further comprises at least one material among silicon (Si), oxygen (O), nitrogen (N), and carbon (C).

4. The blankmask of claim 1, wherein the hard mask film is formed of at least one among SnCON, SnON, SnCN, SnCO, SnO, SnC, SnN, Cr, CrCON, CrON, CrCN, CrCO, CrC, CrN, CrO, CrSn, CrSnCON, CrSnON, CrSnCN, CrSnCO, CrSnC, CrSnN, CrSnO, TaSn, TaSnCON, TaSnON, TaSnCN, TaSnCO, TaSnC, TaSnN, TaSnO, CrTaSnCON, CrTaSnON, CrTaSnCN, CrTaSnCO, CrTaSnO, CrTaSnC, and CrTaSnN.

5. The blankmask of claim 1, wherein the light-shielding layer comprises at least one metal and silicon (Si),
wherein the at least one metal comprises at least one selected from the group consisting of titanium (Ti), vanadium (V), chronimum (Cr), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), cadmium (Cd), indium (In), hafnium (Hf), tantalum (Ta), tungsten (W), osmium (Os), iridium (Ir), platinum (Pt), gold (Au), aluminum (Al), magnesium (Mg), lithium (Li), and selenium (Se); and selectively further comprises at least one material among oxygen (O), nitrogen (N), and carbon (C).

6. The blankmask of claim 5, wherein the light-shielding layer is formed as a single-layer film, a multilayer film including a light block layer and an anti-reflective layer, or a continuous film.

7. The blankmask of claim 6, wherein the light-shielding layer comprises a MoSi compound, a MoTaSi compound, or a combination thereof.

8. The blankmask of claim 7, wherein the MoSi compound comprises at least one among MoSi, MoSiCON, MoSiON, MoSiCN, MoSiCO, MoSiO, MoSiC, and MoSiN, and
the MoTaSi compound comprises at least one among MoTaSi, MoTaSiCON, MoTaSiON, MoTaSiCN, MoTaSiCO, MoTaSiC, MoTaSiN, and MoTaSiO.

9. The blankmask of claim 7, wherein the MoTaSi compound has a composition in which the content of Mo is 1 to 40 at %, the content of Ta is 1 to 40 at %, the content of Si is 30 to 80 at %, the content of nitrogen (N) is 0 to 50 at %, the content of oxygen is 0 to 20 at %, and the content of carbon (C) is 0 to 20 at %, and
the MoSi compound has a composition in which the content of Mo is 1 to 40 at %, the content of Si is 40 to 80 at %, the content of nitrogen (N) is 0 to 50 at %, the content of oxygen is 0 to 20 at %, and the content of carbon (C) is 0 to 20 at %.

10. The blankmask of claim 7, wherein a composition ratio of Mo:Ta:Si included in a sputtering target used to form the MoTaSi compound is 2 to 40 at %:2 to 40 at %:20 to 96 at %, and
a composition ratio of Mo:Si included in a sputtering target used to form the MoSi compound is 5 to 40 at %:60 to 95 at %.

11. The blankmask of claim 5, wherein Si/(Mo+Ta+N), which is a ratio of silicon (Si) to a composition ratio of the light-shielding layer, is 5.0 or less, and
Si/(Mo+N), which is a ratio of silicon (Si) to the composition of the light-shielding layer, is 5.0 or less.

12. The blankmask of claim 1, wherein the hard mask film has a composition in which the content of Cr is 30 to 99 at %, the content of Sn is 1 to 30 at %, the content of oxygen is 0 to 50 at %, the content of nitrogen (N) is 0 to 50 at %, and the content of carbon (C) is 0 to 20 at %.

13. The blankmask of claim 1, wherein the hard mask film is formed using a Cr target and a Sn target, or using a CrSn target,
wherein a composition ratio of Cr:Sn in the CrSn target is 99 at % to 60 at %:1 at % to 40 at %.

14. The blankmask of claim 1, wherein the light-shielding layer has a thickness of 200 Å to 700 Å, and an optical density of 2.0 to 4.0 and a surface reflectivity of less than 50% at the exposure wavelength, and
a variation in a flatness of the light-shielding layer is less than 0.3 μm with respect to the transparent substrate.

15. The blankmask of claim 1, further comprising a resist film formed on the hard mask film,
wherein the resist film has a thickness of 300 Å to 1,500 Å.

16. The blankmask of claim 1, further comprising an etch stopping film disposed between the transparent substrate and the light-shielding layer.

17. The blankmask of claim 1, wherein the light-shielding layer is thermally treated at 200° C. to 500° C.

* * * * *